(12) United States Patent
Tang et al.

(10) Patent No.: US 12,513,884 B2
(45) Date of Patent: Dec. 30, 2025

(54) METHOD FOR MANUFACTURING SEMICONDUCTOR STRUCTURE HAVING GROWTH RATE ON CONDUCTIVE LAYER GREATER THAN ON DIELECTRIC LAYER

(71) Applicant: CHANGXIN MEMORY TECHNOLOGIES, INC., Hefei (CN)

(72) Inventors: Lin Tang, Hefei (CN); Mingguang Zuo, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 371 days.

(21) Appl. No.: 18/329,615

(22) Filed: Jun. 6, 2023

(65) Prior Publication Data
US 2023/0320063 A1  Oct. 5, 2023

Related U.S. Application Data

(63) Continuation of application No. PCT/CN2022/096562, filed on Jun. 1, 2022.

(30) Foreign Application Priority Data

Jan. 14, 2022 (CN) .......................... 202210040837.3

(51) Int. Cl.
H10B 12/00 (2023.01)
(52) U.S. Cl.
CPC ........... H10B 12/053 (2023.02); H10B 12/34 (2023.02); *H10B 12/482* (2023.02); *H10B 12/488* (2023.02)
(58) Field of Classification Search
CPC .. H10B 12/0385; H10B 12/053; H10B 12/34; H10B 12/48; H10B 12/485; H10B 12/488; H01L 21/768; H01L 21/76816
See application file for complete search history.

(56) References Cited

U.S. PATENT DOCUMENTS 6,777,308 B2   8/2004  Li
9,337,209 B1   5/2016  Chiang
(Continued)

FOREIGN PATENT DOCUMENTS

CN   103035501 B   10/2015
CN   110875391 A    3/2020
(Continued)

OTHER PUBLICATIONS

International Search Report in the international application No. PCT/CN2022/096562, mailed on Sep. 19, 2022, 3 pages.

*Primary Examiner* — Hoai V Pham
(74) *Attorney, Agent, or Firm* — Syncoda LLC; Feng Ma

(57) ABSTRACT

A method for manufacturing a semiconductor structure includes the following operations. A substrate is provided. The substrate is provided with a first trench. A dielectric layer is formed on a bottom and sidewalls of the first trench. A first conductive layer is formed on the dielectric layer. A part of the first conductive layer is removed to expose the dielectric layer adjacent to an opening of the first trench. The remaining first conductive layer forms a second trench in the first trench. A bottom width of the second trench is smaller than its top width. A second conductive layer is formed in the first trench. A first growth rate of the second conductive layer on the first conductive layer is greater than a second growth rate of the second conductive layer on the dielectric layer. The semiconductor structure and a memory device are also provided.

13 Claims, 6 Drawing Sheets

(56) References Cited

U.S. PATENT DOCUMENTS

| | | |
|---|---|---|
| 2003/0216006 A1 | 11/2003 | Li |
| 2007/0161203 A1 | 7/2007 | Ang |
| 2010/0164116 A1* | 7/2010 | Li .................. H01L 23/5283 |
| | | 257/E21.597 |
| 2013/0149838 A1 | 6/2013 | Saggio et al. |

FOREIGN PATENT DOCUMENTS

| | | |
|---|---|---|
| CN | 111403282 A | 7/2020 |
| CN | 114361106 A | 4/2022 |

\* cited by examiner

METHOD FOR MANUFACTURING SEMICONDUCTOR STRUCTURE HAVING GROWTH RATE ON CONDUCTIVE LAYER GREATER THAN ON DIELECTRIC LAYER

CROSS-REFERENCE TO RELATED APPLICATIONS

The present application is a U.S. continuation application of International Application No. PCT/CN2022/096562, filed on Jun. 1, 2022, which claims priority to Chinese Patent Application No. 202210040837.3, filed on Jan. 14, 2022. International Application No. PCT/CN2022/096562 and Chinese Patent Application No. 202210040837.3 are incorporated herein by reference in their entireties.

BACKGROUND

In a typical process of manufacturing a conductive structure in a memory device, firstly, deep trenches are formed by plasma etching; secondly, a conductive material is deposited and filled in the deep trenches; thirdly, the excess conductive material is removed by etching to obtain the conductive structure. Since the high aspect ratio of the trenches, voids tend to be present in the conductive material filled in the deep trenches, which will affect the performance of the conductive structure to be formed subsequently, and further affect the reliability of the memory device.

In order to eliminate the influence of the voids in the conductive structure on the reliability of the memory device, typically the conductive material is filled by deposition, etching back, and re-deposition. The voids are exposed by etching back and then the conductive material can be filled into the voids, thereby reducing the presence of voids and eliminating the influence of the voids on the performance of the conductive structure. However, such a treatment method is cumbersome in steps, and there is a risk that the voids are not filled fully, as the cross-sectional shape of the voids is elliptical.

SUMMARY

According to various embodiments of the disclosure, a memory device, a semiconductor structure and a method for manufacturing a semiconductor structure are provided.

A first aspect of the disclosure provides a method for manufacturing a semiconductor structure, which includes the following operations.

A substrate is provided, in which the substrate is provided with a first trench, and a dielectric layer is formed on a bottom and sidewalls of the first trench.

A first conductive layer is formed on the dielectric layer.

A part of the first conductive layer is removed to expose the dielectric layer adjacent to an opening of the first trench, such that the remaining first conductive layer forms a second trench in the first trench, in which a bottom width of the second trench is smaller than a top width of the second trench.

A second conductive layer is formed in the first trench.

A first growth rate of the second conductive layer on the first conductive layer is greater than a second growth rate of the second conductive layer on the dielectric layer.

A further aspect of the disclosure provides a semiconductor structure manufactured by the method for manufacturing a semiconductor structure as described above.

A yet further aspect of the disclosure provides a memory device including the semiconductor structure as described above.

BRIEF DESCRIPTION OF THE DRAWINGS

In order to more clearly illustrate the technical solutions in the embodiments of the disclosure or in the related art, a brief description of the drawings required for describing the embodiments or the related art will be provided below. Apparently, the drawings described below are only some embodiments of the disclosure. For a person of ordinary skill in the art, other drawings can be obtained based on these drawings without creative work.

DETAILED DESCRIPTION

Figure 1:
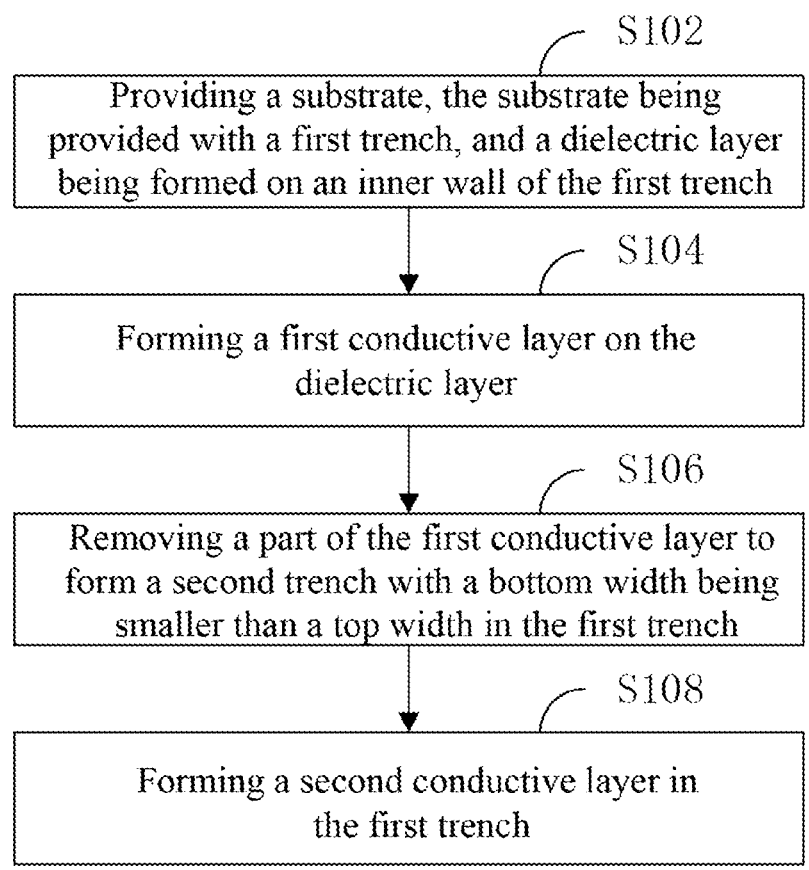
FIG. 1 is a flow chart of a method for manufacturing a semiconductor structure in an embodiment.

In order to facilitate to understand the disclosure, a more thorough description will be provided below with reference to the related accompanying drawings. Illustrative embodiments of the present disclosure are provided in the accompanying drawings. However, the present disclosure may be implemented in various forms and is not limited to the embodiments described herein. Rather, these embodiments are provided so that the present disclosure will be disclosed more thoroughly and fully.

Unless otherwise defined, all technical and scientific terms used herein have the same meanings as those commonly understood by those skilled in the art of the present disclosure. The terms used in the specification of the present disclosure are only used for describing specific embodiments and are not intended to limit the present disclosure. The term "and/or" as used herein includes any and all combinations of one or more related listed items.

In the description of the disclosure, it should be understood that the orientations and positional relationships denoted by the terms "up", "down", "vertical", "horizontal", "inside", "outside" and the like are based on the orientations or positional relationships illustrated in the drawings. They are intended for ease of description of the disclosure and simplification of the description only, and are not intended to indicate or imply that the device or element must have a particular orientation, or be constructed and operated in a particular orientation. Therefore, they cannot be construed as limitations to the disclosure.

It can be understood that the terms "first", "second" and the like used in the disclosure may be used herein to describe various elements, but such elements are not limited by such terms. These terms are only used to distinguish an element from another element. For example, without departure from the scope of the disclosure, the first conductive layer may be referred to as the second conductive layer, and similarly the second conductive layer may be referred to as the first conductive layer. Both the first conductive layer and the second conductive layer are conductive layers, but they are not the same conductive layer.

Furthermore, the terms "first" and "second" are only used for the purpose of description and cannot be understood as indicating or implying the relative importance or implying the number of technical features indicated. Thus, the feature defined with "first", "second" may explicitly or implicitly refer to at least one of the features included. In the description of the disclosure, "multiple" means at least two, such as two, three, etc. unless explicitly and specifically defined otherwise. In the description of the disclosure, "several" means at least one, such as one, two, etc. unless explicitly and specifically defined otherwise.

Figure 2:
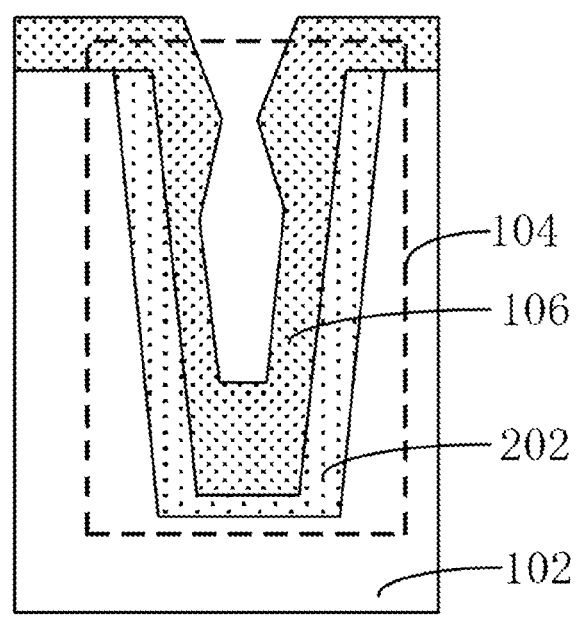
FIG. 2 is a schematic cross-sectional diagram of a semiconductor structure after forming a first conductive layer in an embodiment.
Figure 3:
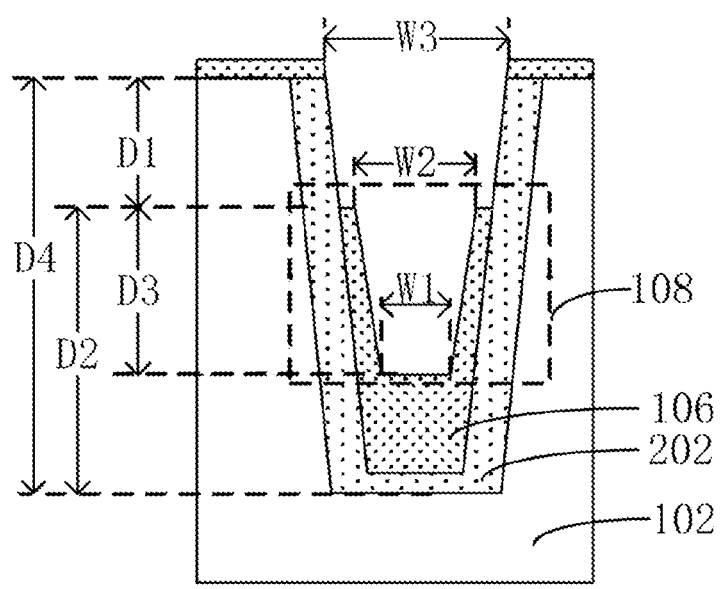
FIG. 3 is a schematic cross-sectional diagram of a semiconductor structure after forming a second trench in the embodiment corresponding to FIG. 2.
Figure 4:
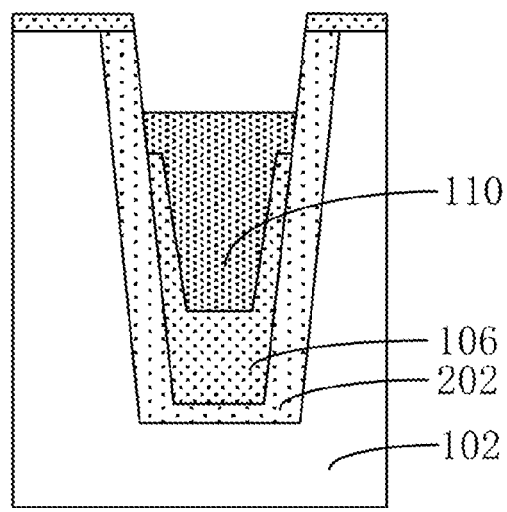
FIG. 4 is a schematic cross-sectional diagram of a semiconductor structure after forming a second conductive layer in the embodiment corresponding to FIG. 3.

FIG. 1 is a flow chart of a method for manufacturing a semiconductor structure in an embodiment. FIG. 2 is a schematic cross-sectional diagram of a semiconductor structure after forming a first conductive layer in an embodiment. FIG. 3 is a schematic cross-sectional diagram of a semiconductor structure after forming a second trench in the embodiment corresponding to FIG. 2. FIG. 4 is a schematic cross-sectional diagram of a semiconductor structure after forming a second conductive layer in the embodiment corresponding to FIG. 3. As shown in FIG. 1, FIG. 2, FIG. 3 and FIG. 4, a method for manufacturing a semiconductor structure is provided in the embodiment, which includes the following operations.

S102, a substrate is provided, in which the substrate is provided with a first trench and a dielectric layer is formed on an inner wall of the first trench.

Specifically, as shown in FIG. 2, a substrate 102 is provided, and the substrate 102 is provided with a first trench 104. A dielectric layer 202 is formed on the inner wall of the first trench 104, and the dielectric layer 202 on the sidewalls of the first trench 104 is mutual separated, that is, the dielectric layer 202 is formed on the bottom and sidewalls of the first trench 104. The substrate 102 may be undoped monocrystalline silicon, impurity-doped monocrystalline silicon, silicon on insulator (SOI), strained silicon on insulator (SSOI), strained silicon germanium on insulator (S—SiGeOI), silicon germanium on insulator (SiGeOI), germanium on insulator (GeOI), and the like. As an example, in the embodiment, the material of the substrate 102 is monocrystalline silicon. As can be understood, the dielectric layer 202 may be directly formed on the inner wall of the first trench by a film forming process, such as chemical vapor deposition, a furnace tube process or the like, which are well-known to those skilled in the art. Alternatively, the first trench may be filled with a dielectric material by a film forming process, such as chemical vapor deposition, a furnace tube process or the like, and then the excess dielectric material is removed by photolithography or etching, so as to obtain the dielectric layer 202 composed of the dielectric material on the inner wall of the trench.

S104, a first conductive layer is formed on the dielectric layer.

Specifically, a first conductive layer 106 is formed on the dielectric layer 202. The first conductive layer 106 is filled in the first trench 104, and extends along the sidewall of the first trench 104 to cover the substrate 102. The dielectric layer 202 can prevent the conductive particles in the first conductive layer 106 from diffusing into the substrate 102.

In one embodiment, the first conductive layer 106 is located on the surface of the dielectric layer 202. That is, the lower surface of the first conductive layer 106 is in contact with the upper surface of the dielectric layer 202.

S106, a part of the first conductive layer is removed, to form a second trench in the first trench, in which a bottom width of the second trench is smaller than a top width of the second trench.

Specifically, as shown in FIG. 3, a part of the first conductive layer 106 is removed to expose the dielectric layer 202 adjacent to the opening of the first trench 104, such that the remaining first conductive layer 106 forms the second trench 108 in the first trench 104, in which a bottom width of the second trench 108 is smaller than a top width of the second trench 108. As can be understood, the first conductive layer 106 located on the sidewall of the first trench 104 can be divided into a first part and a second part of the first conductive layer 106, in which the first part of the first conductive layer 106 is located at the opening of the first trench 104, which needs to be completely removed, and the second part of the first conductive layer 106 is located adjacent to the bottom of the first trench 104, which needs to be at least partially retained. After the first part of the first conductive layer 106 is removed by dry etching and/or wet etching well known to those skilled in the art, the dielectric layer 202 under the first part of the first conductive layer 106 is exposed. At this time, the second part of the first conductive layer 106 and the first conductive layer 106 located at the bottom of the first trench 104 constitute the second trench 108. As can be understood, in the process of removing a part of the first conductive layer 106, the first conductive layer 106 at the bottom of the first trench 104 may be partially removed in a thickness direction, or the first conductive layer 106 at the bottom of the first trench 104 may not be removed, when the first part of the first conductive layer 106 is removed. By removing a part of the first conductive layer 106, the dielectric layer 202 adjacent to the opening of the first trench 104 is exposed, and the second trench 108 is formed in the first trench 104 by the remaining first conductive layer 106, so that no voids will be present in the remaining first conductive layer 106. Further, the bottom width of the second trench 108 is smaller than the top width of the second trench 108, so that the trench to be filled has a large opening and a small bottom, which is not prone to generate voids during forming the second conductive layer subsequently.

S108, a second conductive layer is formed in the first trench.

Specifically, as shown in FIG. 4, a second conductive layer 110 is formed in the first trench 104 by filling, in which the first growth rate V1 of the second conductive layer 110 on the first conductive layer 106 is greater than the second growth rate V2 of the second conductive layer 110 on the dielectric layer 202. Since the first trench 104 has been filled with a certain thickness of the first conductive layer 106, the aspect ratio of the first trench 104 to be filled is reduced when forming the second conductive layer 110, thereby reducing the probability of the presence of voids. Moreover, the bottom width W1 of the second trench 108 is smaller than the top width W2 of the second trench 108, which further reduces the probability of the formation of voids in the second conductive layer 110 formed in the first trench 104 (on the first conductive layer 106), thereby improving the performance of the conductive structure composed of the first conductive layer 106 and the second conductive layer 110 and improving the reliability of the semiconductor structure. In practice, the thickness of the first conductive layer 106, the thickness of the second conductive layer 110, and the difference between the bottom width W1 of the second trench 108 and the top width W2 of the second trench 108 may be set according to process requirements.

The method for manufacturing the semiconductor structure described above includes the following operations. A substrate is provided, in which the substrate is provided with a first trench, and a dielectric layer is formed on a bottom and sidewalls of the first trench. A first conductive layer is formed on the dielectric layer. A part of the first conductive layer is removed to expose the dielectric layer adjacent to an opening of the first trench, such that the remaining first conductive layer forms a second trench in the first trench, in which a bottom width of the second trench is smaller than a top width of the second trench. Then, a second conductive layer is formed in the first trench, in which a first growth rate of the second conductive layer on the first conductive layer is greater than a second growth rate of the second conductive layer on the dielectric layer. In the disclosure, a part of the first conductive layer is removed to expose the dielectric layer located at the opening of the first trench, so as to obtain a second trench whose bottom width is smaller than its top width, so that no voids will be present in the first conductive layer. Moreover, the bottom width of the second trench is set to be smaller than the top width thereof, and the second conductive layer is formed in the first trench, in which the first growth rate of the second conductive layer on the first conductive layer is greater than the second growth rate of the second conductive layer on the dielectric layer, so that the first trench will not be sealed in advance in the process of forming the second conductive layer and the presence of voids can be avoided. As a result, the performance of the conductive structure composed of the first conductive layer and the second conductive layer is improved, thereby improving the reliability of the semiconductor structure.

As an example, the dielectric layer 202 extends along the sidewalls of the first trench 104 to cover the substrate 102, which prevents the conductive particles in the first conductive layer 106 from diffusing into the substrate 102 while avoiding the damage to the substrate 102 in S106.

As an example, between S104 and S106, the method may also include a part of the first conductive layer 106 on the surface of the substrate 102 is removed by chemical mechanical polishing, so that the surface of the first conductive layer 106 is flattened, which facilitates subsequent processes.

As an example, the materials of the first conductive layer 106 and the second conductive layer 110 are different. As can be understood, the materials of the first conductive layer 106 and the second conductive layer 110 have good lattice matching. Alternatively, there is an adhesion layer (not shown in the figures) between the first conductive layer 106 and the second conductive layer 110, and the growth rate of the second conductive layer 110 on the adhesion layer is greater than that on the dielectric layer 202. This arrangement has the purpose of improving the bonding performance of the first conductive layer 106 and the second conductive layer 110 and preventing delamination cracking.

As an example, the materials of the first conductive layer 106 and the second conductive layer 110 are the same. By this arrangement, delamination cracking between the first conductive layer 106 and the second conductive layer 110 can be avoided.

As an example, the materials of the first conductive layer 106 and the second conductive layer 110 both include metal molybdenum.

As an example, the first conductive layer 106 and the second conductive layer 110 are formed by atomic layer deposition.

As an example, a process gas of atomic layer deposition includes at least one of molybdenum hexacarbonyl, molybdenum pentachloride or molybdenum dichlorodioxide.

As an example, the thickness of the first conductive layer 106 at a sidewall of the second trench 108 is smaller than the thickness of the first conductive layer 106 at the bottom of the second trench 108, so as to further reduce the probability of the presence of voids in the process of forming the second conductive layer 110.

As an example, the thickness of the first conductive layer 106 at a sidewall of the second trench 108 is gradually reduced from the bottom of the second trench 108 to the opening of the second trench 108.

As shown in FIG. 3, as an example, the ratio of the extension length of the dielectric layer 202 free from being covered by the first conductive layer 106 to the extension length of the dielectric layer 202 covered by the first conductive layer 106 is ½ to ¾ in an extension direction of the sidewalls. That is, the ratio of the distance D1 between the opening of the first trench 104 and the opening of the second trench 108 to the distance D2 between the opening of the second trench 108 and the bottom of the first trench 104 is 0.5-0.75, such as 0.5, 0.6, 0.7, and 0.75. For example, the ratio of the distance D1 to the distance D2 is 65/75.

With continued reference to FIG. 3, as an example, the ratio of the depth D3 of the second trench 108 to the depth D4 of the first trench 104 is smaller than the ratio of the opening width W2 of the second trench 108 to the opening width W3 of the first trench 104, so that the probability of the presence of voids in the process of forming the second conductive layer 110 can be reduced while the filling difficulty of the second conductive layer can be reduced.

As an example, the part of the first conductive layer 106 is removed by dry etching.

As an example, the first etching rate V1 for etching the first conductive layer 106 is greater than the second etching rate V2 for etching the dielectric layer 202 by the dry etching. Specifically, in the etching process for removing a part of the first conductive layer 106, the first etching rate V1 for removing the first conductive layer 106 by etching is greater than the second etching rate V2 for removing the dielectric layer 202 by etching. With this arrangement, damage to the dielectric layer 202 during removing a part of the first conductive layer 106 can be avoided. It can be understood that the first etching rate V1 for removing the first conductive layer 106 by etching is also greater than the third etching rate V3 for removing the substrate 102 by etching. With this arrangement, damage to the substrate 102 can be avoided during removing a part of the first conductive layer 106.

As an example, the dry etching process has a chamber pressure of 2.5 mT-6 mT, such as 2.5 mT, 2.7 mT, 2.9 mT, 3 mT, 3.5 mT, 3.7 mT, 3.9 mT, 4.0 mT, 4.3 mT, 4.5 mT, 4.7 mT, 4.9 mT, 5.0 mT, 5.5 mT, 5.7 mT, 5.9 mT, 6.0 mT, an etching power of 400 W-600 W, such as 400 W, 430 W, 450 W, 470 W, 490 W, 500 W, 530 W, 550 W, 570 W, 590 W, 600 W, a pulse frequency of 800 Hz-1200 Hz, such as 800 Hz, 830 Hz, 850 Hz, 870 Hz, 890 Hz, 900 Hz, 950 Hz, 970 Hz, 990 Hz, 1000 Hz, 1100 Hz, 1200 Hz, a flow rate of process gas Ar of 100 sccm-200 sccm, such as 100 sccm, 110 sccm, 130 sccm, 150 sccm, 170 sccm, 190 sccm, 200 sccm, a flow rate of process gas SF6 of 15 sccm-25 sccm, such as 15 sccm, 17 sccm, 19 sccm, 20 sccm, 21 sccm, 22 sccm, 24 sccm, 25 sccm, and a process temperature of 50° C.-70° C., such as 50° C., 53° C., 55° C., 57° C., 59° C., 60° C., 63° C., 65° C., 67° C., 69° C., 70° C.

As an example, the material of the dielectric layer includes an oxide or a nitride. As an example, the material of the dielectric layer 202 includes at least one of an oxide, a nitride, and a nitrogen oxide. For example, the material of the dielectric layer 202 is at least one of silicon nitride, silicon dioxide, and silicon oxynitride.

As an example, the material of the dielectric layer 202 is silicon dioxide. A layer of silicon dioxide is formed on the sidewalls of the first trench by thermal oxidation, further simplifying the process operations.

As shown in FIG. 4, as an example, the upper surface of the second conductive layer 110 is lower than the opening of the first trench 104.

Figure 5:
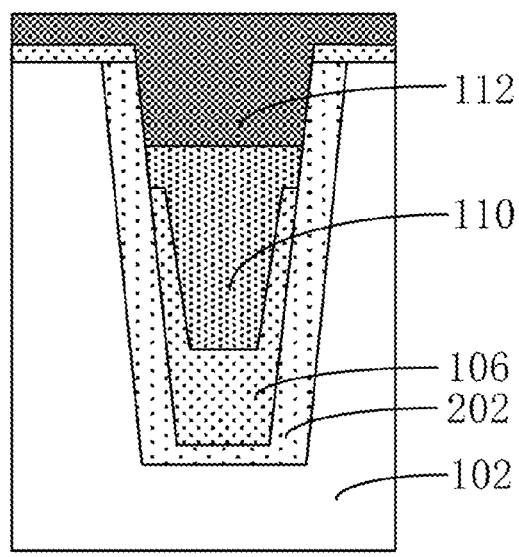
FIG. 5 is a schematic cross-sectional diagram of a semiconductor structure after full deposition in the embodiment corresponding to FIG. 4.

FIG. 5 is a schematic cross-sectional diagram of a semiconductor structure after full deposition in the embodiment corresponding to FIG. 4. As shown in FIG. 5, as an example, after S108, the method includes that a third conductive material layer 112 is formed in the first trench 104. The third conductive material layer 112 fully fills the first trench 104, and extends along the sidewalls of the first trench 104 to cover the substrate 102. Exemplarily, the third conductive material layer 112 has at least the same material as one of the first conductive layer 106 and the second conductive layer 110.

Figure 6:
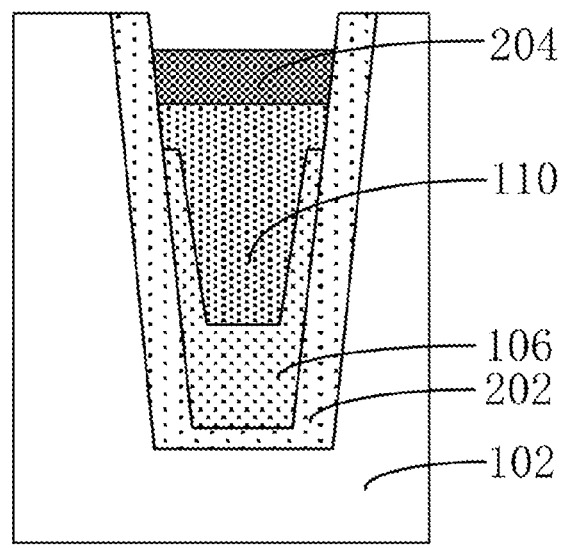
FIG. 6 is a schematic cross-sectional diagram of a semiconductor structure after forming a conductive structure in the embodiment corresponding to FIG. 5.

FIG. 6 is a schematic cross-sectional diagram of a semiconductor structure after forming a conductive structure in the embodiment corresponding to FIG. 5. As shown in FIG. 6, as an example, the method for manufacturing the semiconductor structure further includes removing the excess third conductive material layer 112 to obtain the third conductive layer 204 located in the first trench, in which the first conductive layer 106, the second conductive layer 110 and the third conductive layer 204 together constitute a conductive structure of the semiconductor structure. Specifically, the excess third conductive material layer 112 is removed by chemical mechanical polishing and etching. Exemplarily, the excess first conductive layer 106 and the excess second conductive layer 110 (dielectric layer 202) on the substrate 102 are removed while the excess third conductive material layer 112 is removed.

As an example, the upper surface of the third conductive layer 204 is lower than the opening of the first trench 104. Exemplarily, the semiconductor structure includes a memory device, and the conductive structure is a buried word line structure or a buried bit line structure in a memory device.

As an example, the upper surface of the third conductive layer 204 is flush with the opening of the first trench 104.

It should be understood that although the respective operations in the flow chart of FIG. 1 are shown in sequence as indicated by the arrows, these operations are not necessarily performed in sequence as indicated by the arrows. Unless explicitly stated herein, the sequence of these operations are not strictly limited, and these operations can be performed in other sequences. Further, at least some of the operations in FIG. 1 may include a plurality of sub-operations or sub-stages. These sub-operations or sub-stages are not necessarily performed at the same time, but may be performed at different times. Moreover, these sub-operations or sub-stages are not necessarily performed in sequence, but may be performed in turn or alternately with other operations or at least some of the sub-operations or sub-stages in other operations.

Embodiments of the disclosure provide a semiconductor structure manufactured by the method for manufacturing a semiconductor structure in any one of the above embodiments.

As an example, the semiconductor structure includes a bipolar transistor or a field effect transistor.

In the above semiconductor structure, a part of the first conductive layer is removed in the manufacturing process to expose the dielectric layer located at the opening of the first trench, so as to obtain a second trench whose bottom width is smaller than its top width, so that no voids will be present in the first conductive layer. Moreover, the bottom width of the second trench is set to be smaller than the top width thereof, and the second conductive layer is formed in the first trench, in which the first growth rate of the second conductive layer on the first conductive layer is greater than the second growth rate of the second conductive layer on the dielectric layer, so that the first trench will not be sealed in advance in the process of forming the second conductive layer and the presence of voids is avoided. As a result, the performance of the conductive structure composed of the first conductive layer and the second conductive layer is improved, thereby improving the reliability of the semiconductor structure.

Embodiments of the disclosure provide a memory device including the semiconductor structure as described above.

Embodiments of the disclosure provide an electronic apparatus including the semiconductor structure as described above.

Embodiments in this specification are described in a progressive manner and each embodiment focuses on differences from other embodiments. Same and similar parts between the embodiments can be referred to each other.

The technical features of the above-described embodiments may be arbitrarily combined. In order to describe briefly, not all possible combinations of the technical features of the above-described embodiments are described. However, as long as there is no contradiction in the combinations of these technical features, they should be considered within the scope described in this specification.

The above-mentioned embodiments only represent several implementations of the disclosure, and the descriptions thereof are relatively specific and detailed, but should not be construed as a limitation to the scope of the disclosure. It should be noted that multiple improvements and modifications may be made by those skilled in the art without departure from the concept of the disclosure, which fall within the protection scope of the disclosure. Therefore, the protection scope of the disclosure shall be subject to the protection scope of the claims.

The invention claimed is:

1. A method for manufacturing a semiconductor structure, comprising:
   providing a substrate, the substrate being provided with a first trench, and a dielectric layer being formed on a bottom and sidewalls of the first trench;
   forming a first conductive layer on the dielectric layer;
   removing a part of the first conductive layer to expose the dielectric layer adjacent to an opening of the first trench, such that a remaining first conductive layer forms a second trench in the first trench, wherein a bottom width of the second trench is smaller than a top width of the second trench; and
   forming a second conductive layer in the first trench;
   wherein a first growth rate of the second conductive layer on the first conductive layer is greater than a second growth rate of the second conductive layer on the dielectric layer.

2. The method according to claim 1, wherein materials of the first conductive layer and the second conductive layer are the same.

3. The method according to claim 2, wherein the materials of the first conductive layer and the second conductive layer both comprise metal molybdenum.

4. The method according to claim 3, wherein the first conductive layer and the second conductive layer are formed by atomic layer deposition.

5. The method according to claim 4, wherein a process gas of the atomic layer deposition comprises at least one of molybdenum hexacarbonyl, molybdenum pentachloride or molybdenum dichlorodioxide.

6. The method according to claim 1, wherein a thickness of the first conductive layer at a sidewall of the second trench is smaller than a thickness of the first conductive layer at a bottom of the second trench.

7. The method according to claim 1, wherein a thickness of the first conductive layer at a sidewall of the second trench is gradually reduced from a bottom of the second trench to an opening of the second trench.

8. The method according to claim 1, wherein the part of the first conductive layer is removed by dry etching.

9. The method according to claim 8, wherein a first etching rate for etching the first conductive layer is greater than a second etching rate for etching the dielectric layer by the dry etching.

10. The method according to claim 8, wherein the dry etching has a chamber pressure of 2.5 mT-6 mT, an etching power of 400 W-600 W, a pulse frequency of 800 Hz-1200 Hz, a flow rate of process gas Ar of 100 sccm-200 sccm, a flow rate of process gas SF6 of 15 sccm-25 sccm, and a process temperature of 50° C.-70° C.

11. The method according to claim 1, wherein a material of the dielectric layer comprises an oxide or a nitride.

12. The method according to claim 1, wherein a ratio of an extension length of the dielectric layer free from being covered by the first conductive layer to an extension length of the dielectric layer covered by the first conductive layer is ½ to ¾ in an extension direction of the sidewalls.

13. The method according to claim 1, wherein a ratio of a depth of the second trench to a depth of the first trench is less than a ratio of an opening width of the second trench to an opening width of the first trench.

\* \* \* \* \*